United States Patent
Boniardi et al.

(10) Patent No.: US 9,871,078 B2
(45) Date of Patent: **\*Jan. 16, 2018**

(54) MEMORY ARRAYS AND METHODS OF FORMING MEMORY ARRAYS

(71) Applicant: Micron Technology, Inc., Boise, ID (US)

(72) Inventors: Mattia Boniardi, Cormano (IT); Andrea Redaelli, Casatenovo (IT)

(73) Assignee: Micron Technology, Inc., Boise, ID (US)

( \* ) Notice: Subject to any disclaimer, the term of this patent is extended or adjusted under 35 U.S.C. 154(b) by 0 days.

This patent is subject to a terminal disclaimer.

(21) Appl. No.: 15/421,855

(22) Filed: Feb. 1, 2017

(65) Prior Publication Data

US 2017/0148852 A1    May 25, 2017

Related U.S. Application Data

(62) Division of application No. 14/803,303, filed on Jul. 20, 2015, now Pat. No. 9,614,007.

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/06* (2013.01); *H01L 45/1233* (2013.01); *H01L 45/1253* (2013.01); *H01L 45/141* (2013.01); *H01L 45/1666* (2013.01)

(58) Field of Classification Search
CPC ............ H01L 27/2463; H01L 27/2481; H01L 45/1233
See application file for complete search history.

(56) References Cited

U.S. PATENT DOCUMENTS

| | | |
|---|---|---|
| 6,351,406 B1 | 2/2002 | Johnson et al. |
| 6,690,026 B2 | 2/2004 | Peterson |
| 7,772,583 B2 | 8/2010 | Liu |
| 8,274,130 B2 | 9/2012 | Mihnea et al. |
| 8,786,040 B2 | 7/2014 | Doyle et al. |

*Primary Examiner* — Allison P Bernstein
(74) *Attorney, Agent, or Firm* — Wells St. John P.S.

(57) ABSTRACT

Some embodiments include a memory array having a first memory cell adjacent to a second memory cell along a lateral direction. The second memory cell is vertically offset relative to the first memory cell. Some embodiments include a memory array having a series of data/sense lines extending along a first direction, a series of access lines extending along a second direction, and memory cells vertically between the access lines and data/sense lines. The memory cells are arranged in a grid having columns along the first direction and rows along the second direction. Memory cells in a common column and/or row as one another are arranged in two alternating sets, with a first set having memory cells at a first height and a second set having memory cells at a second height vertically offset relative to the first height. Some embodiments include methods of forming memory arrays.

20 Claims, 16 Drawing Sheets

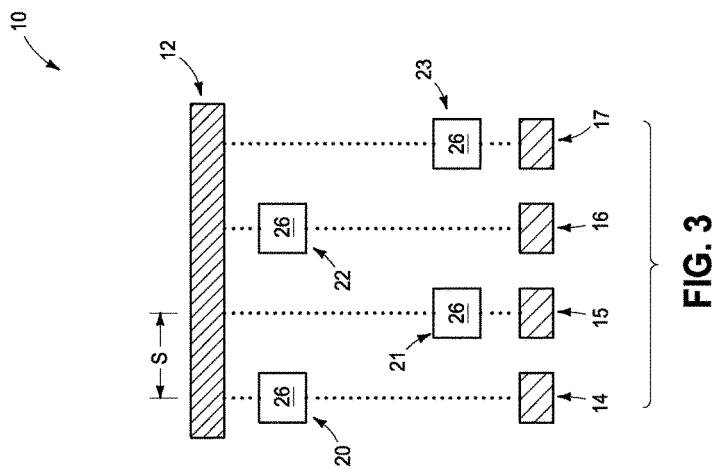
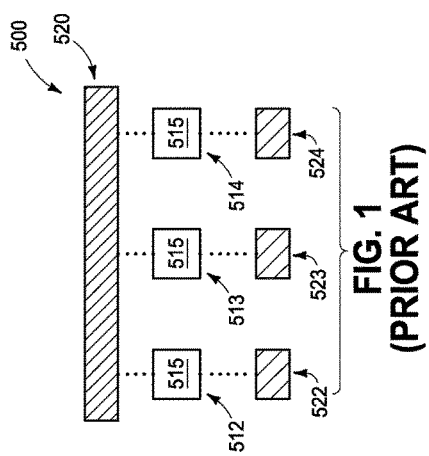
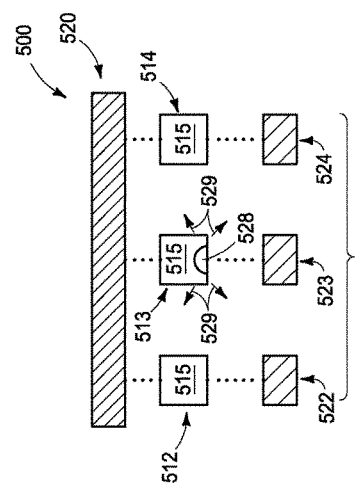

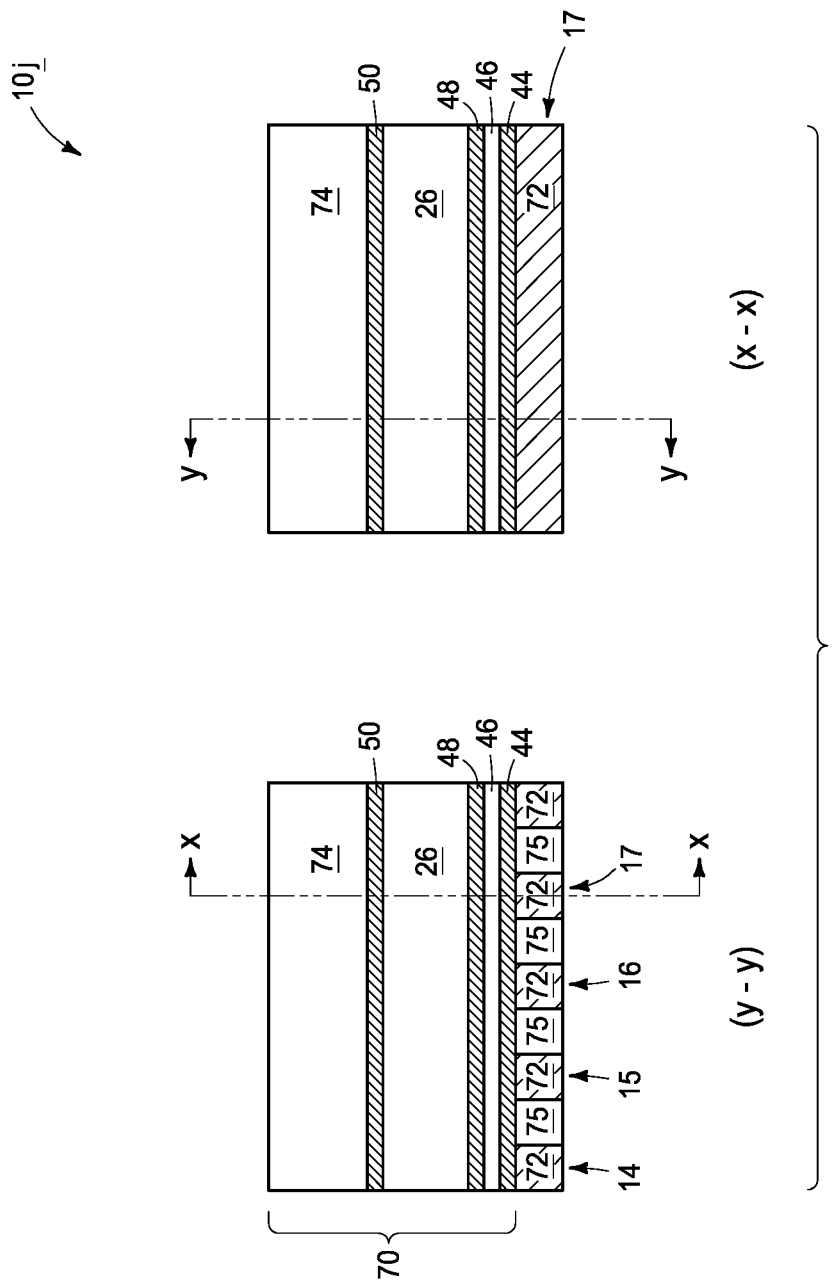

US 9,871,078 B2

1

MEMORY ARRAYS AND METHODS OF FORMING MEMORY ARRAYS

RELATED PATENT DATA

This application resulted from a divisional of U.S. patent application Ser. No. 14/803,303 which was filed Jul. 20, 2015 and which is hereby incorporated by reference herein.

TECHNICAL FIELD

Memory arrays and methods of forming memory arrays.

BACKGROUND

Memory is one type of integrated circuitry and is used in electronic systems for storing data. Integrated memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Resistive random access memory (RRAM) is a class of memory that is of interest for utilization in existing and future data storage needs. RRAM utilizes programmable material having two or more stable states that differ in resistivity relative to one another. Example types of memory cells that may be utilized in RRAM are phase change memory (PCM) cells, programmable metallization cells (PMCs), conductive bridging random access memory (CBRAM) cells, nanobridge memory cells, electrolyte memory cells, binary oxide cells, and multilayer oxide cells (for instance, cells utilizing multivalent oxides). The memory cell types are not mutually exclusive. For example, CBRAM and PMC are overlapping classification sets.

PCM utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

A difficulty that may be encountered during utilization of PCM is described with reference to FIGS. 1 and 2. FIG. 1 shows a portion of a construction 500 comprising a PCM array. The array comprises memory cells 512-514, with each memory cell comprising phase change material 515.

The memory cells are between a bitline 520 and wordlines 522-524. The illustrated memory cells 512-514 are along a single column of the memory array, and accordingly are connected to a common bitline. The wordlines 522-524 extend in and out of the page relative to the cross-sectional view of FIG. 1, and may connect the illustrated memory cells with other memory cells (not shown) along rows of the memory array. Dashed lines are provided between the memory cells 512-514 and the bitline 520, as well as between the memory cells and the wordlines 522-524. Such dashed lines are utilized to indicate that there may be additional structures or materials between the bitline and the memory cells, as well as between the wordlines and the memory cells.

Electrically insulative material (not shown) is provided between the memory cells. The electrically insulative mate-

2 rial may comprise a single composition or may comprise multiple different compositions.

Referring to FIG. 2, memory cell 513 may be selectively programmed through appropriate electrical stimulus along bitline 520 and wordline 523. Such programming may involve utilizing a heater material (not shown) to raise a temperature of programmable material 515 to at least about a transition temperature suitable to alter crystallinity within material 515. Such temperature raise creates a region 528 within the programmable material of memory cell 513 having altered physical properties, and thus transitions the memory cell to a different memory state than the adjacent memory cells 512 and 514.

A problem that may occur during the programming of memory cell 513 is thermal crosstalk between memory cell 513 and the adjacent memory cells 512 and 514. Arrows 529 are provided to diagrammatically illustrate thermal energy migrating outwardly from memory cell 513 during the programming of such memory cell. The thermal crosstalk may cause a so-called "program-disturb" phenomena in which data is lost from a memory cell during programming of a neighboring memory cell.

It would be desirable to alleviate or prevent thermal crosstalk between neighboring memory cells of PCM arrays.

The problem of thermal cross-talk may be present in other RRAM architectures besides PCM, and it would desirable to develop arrangements that could be incorporated into such other RRAM architectures to alleviate or prevent thermal crosstalk between neighboring memory cells.

BRIEF DESCRIPTION OF THE DRAWINGS

FIG. 1 is a view of a prior art construction.

FIG. 2 is a view of a prior art construction illustrating a programming operation.

FIG. 3 is a diagrammatic sectional view of a region of an example embodiment memory array.

FIGS. 13-22 are diagrammatic cross-sectional views of regions of a construction at example embodiment process stages that may be utilized in fabricating an example embodiment memory array. Each figure has an x-x section and a y-y section, with the x-x section being along the line x-x of the y-y section, and with the y-y section being along the line y-y of the x-x section.

DETAILED DESCRIPTION OF THE ILLUSTRATED EMBODIMENTS

Figure 4:
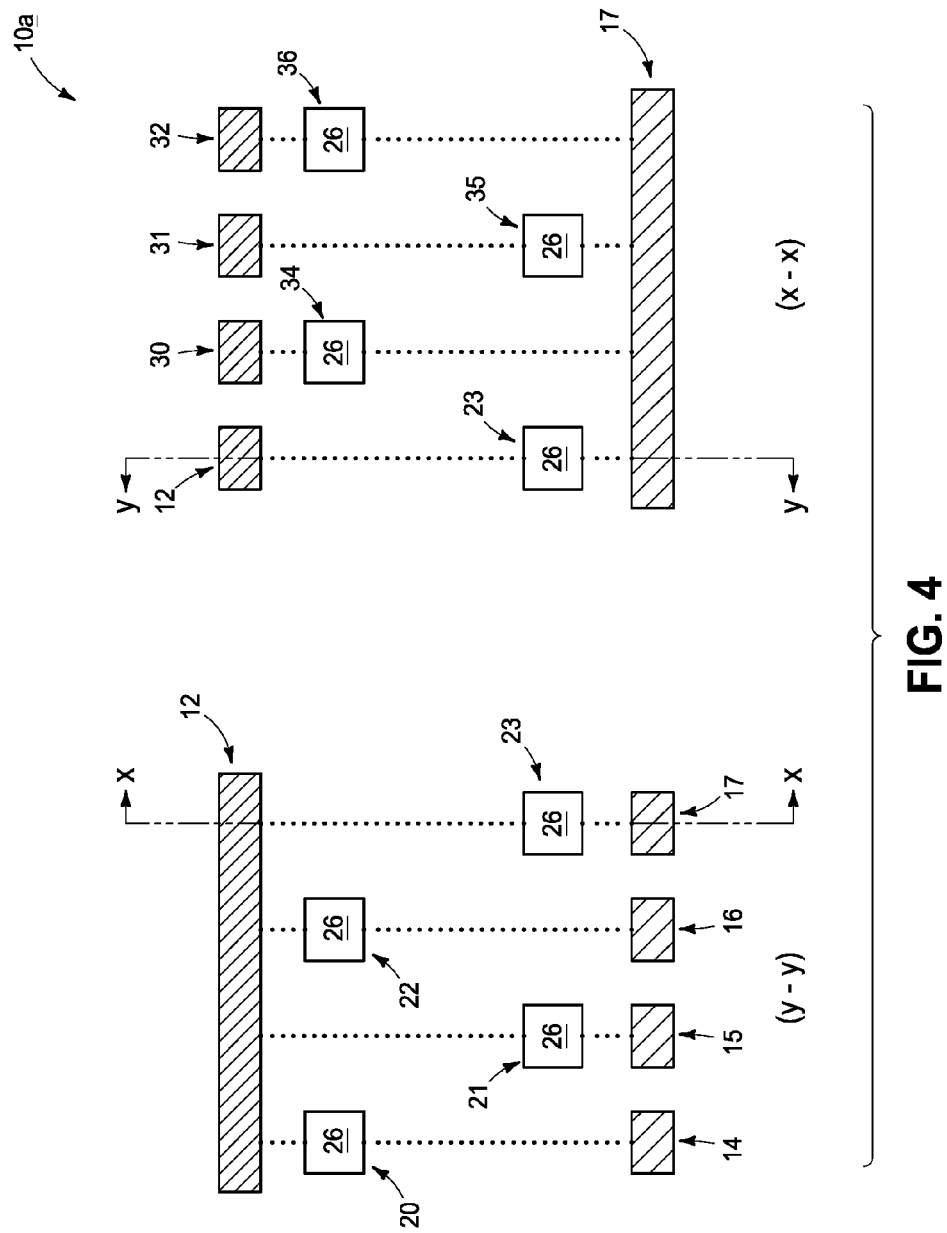
FIGS. 4 and 5 are diagrammatic sectional views of regions of example embodiment memory arrays. Each figure has an x-x section and a y-y section, with the x-x section being along the line x-x of the y-y section, and with the y-y section being along the line y-y of the x-x section.

In some embodiments, adjacent memory cells are vertically offset relative to one another in order to alleviate or prevent thermal crosstalk between the memory cells. Some embodiments pertain to three-dimensional cross-point memory, and to improved architectures enabling tight stacking and associated high integration. Example embodiments are described with reference to FIGS. 3-22.

Referring to FIG. 3, a portion of a memory array 10 is illustrated.

A line 12 extends along a first direction coextensive with the page. The line may be a data/sense line or access line. An example data/sense line is a bitline. In some embodiments the line 12 may be a bitline. The first direction may be referred to as a bitline direction or data/sense line direction.

Additional lines 14-17 extend along a second direction in and out of the page. The lines 14-17 may be data/sense lines or access lines. Example access lines are wordlines. In some embodiments, lines 14-17 may be wordlines. The second direction may be referred to as a wordline direction or an access line direction.

Memory cells 20-23 are between the wordlines and the bitline. The memory cells may correspond to RRAM, and in particular embodiments may correspond to phase change memory (PCM) cells. The memory cells comprise programmable material 26, which is material that retains a memory state (i.e., which corresponds to a programmable region of a memory cell). If the memory cells correspond to PCM, the programmable material may be phase change material; such as, for example, chalcogenide.

The memory cells are arranged in a configuration such that directly adjacent (i.e. neighboring) memory cells are vertically offset relative to one another. Specifically, the memory cells 20 and 22 are at a first height, and the memory cells 21 and 23 are at a second height which is vertically offset relative to the first height. In some embodiments, the memory cells 20 and 22 may be considered to be part of a first set of memory cells, and the memory cells 21 and 23 may be considered to be part of a second set, with the first and second sets being vertically offset relative one another. In some embodiments, or in other words, memory cell 20 is vertically offset relative to adjacent memory cell 21, and memory cell 22 is vertically offset relative to adjacent memory cells 21 and 23.

The vertical offset of neighboring cells may alleviate or prevent thermal crosstalk between the neighboring cells in that such vertical offset effectively increases a distance between the neighboring cells. However, the cells may still be tightly packed into a highly integrated configuration. In some embodiments, neighboring cells may be laterally spaced by a spacing distance S of less than or equal to 100 nanometers (nm). For instance, the spacing distance may be within a range of from about 1 nm to about 100 nm. It is often found that thermal crosstalk becomes problematic in conventional architectures when spacing between adjacent cells is less than or equal to 100 nm. The vertical offset of neighboring memory cells may enable tight lateral spacings of memory cells to be achieved while avoiding the problematic thermal crosstalk of conventional architectures.

Dashed lines are provided between the memory cells 20-23 and the bitline 12, as well as between the memory cells and the wordlines 14-17. Such dashed lines are utilized to indicate that there may be additional structures or materials between the bitline and the memory cells, as well as between the wordlines and the memory cells. Example additional structures/materials are electrode material(s), select device material(s), barrier material(s), interface(s), etc.

FIG. 3 illustrates a section along a bitline of a memory array, and shows that neighboring cells are vertically offset from one another along the bitline direction. The memory array would actually comprise a grid of memory cells, with rows along the wordlines and columns along the bitlines. Accordingly, FIG. 3 illustrates that neighboring cells are vertically offset from one another along a column of the memory array grid. The memory cells may also be vertically offset from one another along rows of the memory array grid in some embodiments (as shown in FIG. 4), and in other embodiments may be at a common vertical height with one another along the rows (as shown in FIG. 5).

Figure 5:
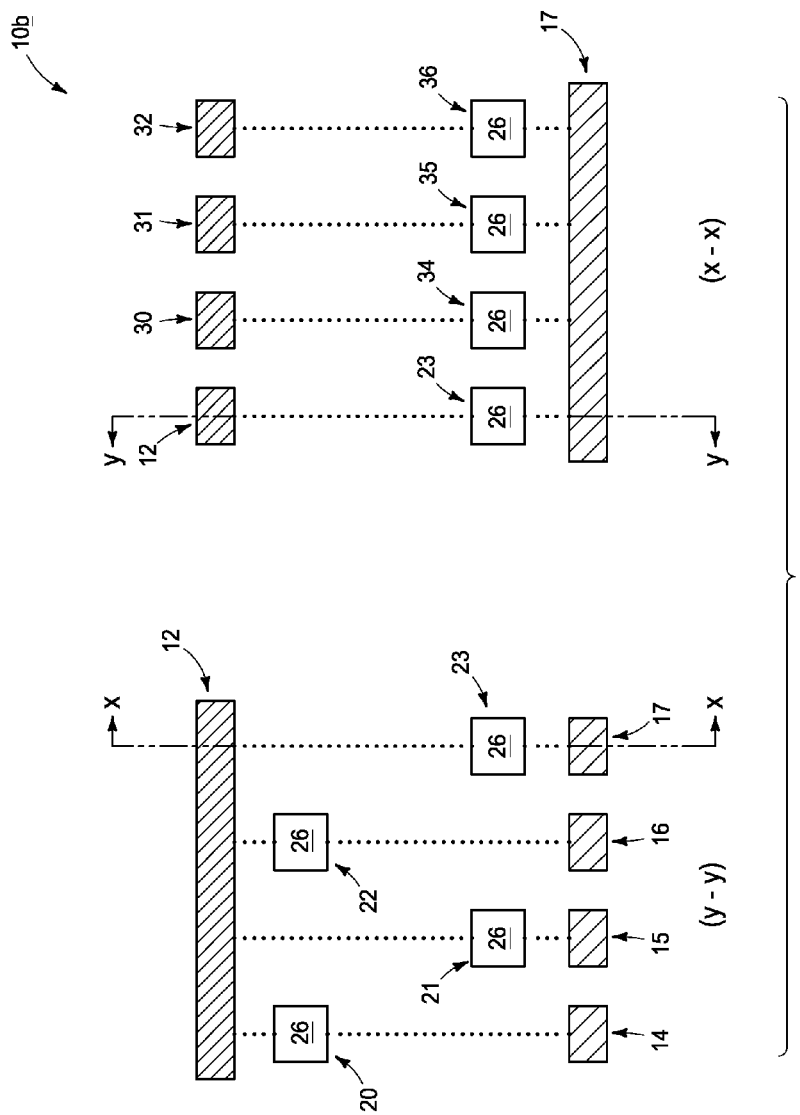

Specifically, FIGS. 4 and 5 illustrate regions of memory arrays 10a and 10b, respectively, in which a section along the wordline direction (x-x) is illustrated together with the section along the bitline direction (y-y). The sections along the wordline direction (x-x) show that bitline 12 is one of a plurality of bitlines 12, 30, 31 and 32; and show memory cells 23, 34, 35 and 36 arranged along the wordline direction. The memory cells may be in a vertically-staggered configuration as shown in FIG. 4, or may be in a vertically-static configuration as shown in FIG. 5. Although the embodiment of FIG. 5 specifically shows the memory cells being vertically static along the lower height of the two vertically-offset heights of FIG. 3, in other embodiments the memory cells may be vertically static along the upper height of the two vertically-offset heights.

One aspect of the embodiments of FIGS. 4 and 5 is that sense/access lines (e.g., wordlines and bitlines) extend along x and y axes of a memory grid, and neighboring memory cells are displaced relative to one another along a z-axis (i.e., an axis orthogonal to the x and y axes). To the extent that there is a hotspot associated with a memory cell during operation (for example, programming) of the memory cell, the displacement of neighboring memory cells along the z-axis may enable such neighboring cells to be far enough removed from the hotspot so that data integrity within the neighboring memory cells is not impacted by thermal energy migrating from the hotspot.

The configurations of FIGS. 3-5 show memory cells arranged in memory array grids in which programmable regions of memory cells in a common column as one another (i.e., along a common bitline) are vertically staggered, and in which programmable regions of memory cells in a common row as one another (i.e., along a common wordline) may be vertically staggered or vertically static. In other embodiments, the memory array grid may have programmable regions of memory cells in a common row as one another vertically staggered, and may have the programmable regions of memory cells in a common column as one another either vertically staggered or vertically static.

Figure 7:
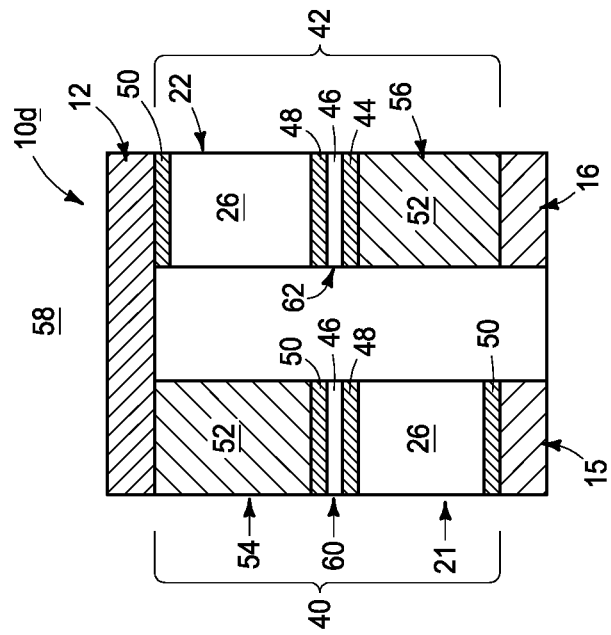
FIGS. 6 and 7 are diagrammatic cross-sectional views of regions of example embodiment memory arrays.
Figure 6:
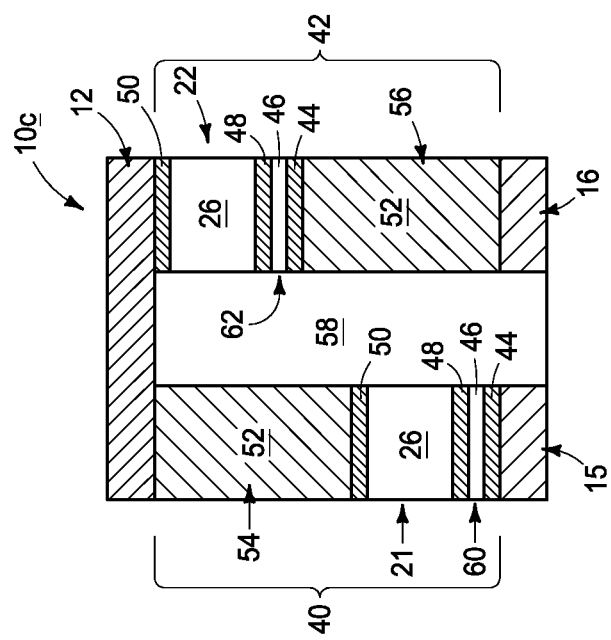

The memory cell arrangements described above with reference to FIGS. 3-5 may be utilized in conjunction with any types of memory cells in which propagated disturbances between adjacent memory cells are problematic (for instance, in which thermal disturbances are problematic), and may be of particular benefit with respect to memory cells in which programmable material changes in resistivity in transitioning from one memory state to another. FIGS. 6 and 7 show example applications suitable for utilization with resistive RAM (RRAM).

Referring to FIG. 6, a portion of a memory array 10c is shown to comprise a bitline 12 and a pair of wordlines 15 and 16. The memory cell 21 is within a first vertical stack 40 over wordline 15, and the memory cell 22 is within a second vertical stack 42 over wordline 16.

The first vertical stack 40 includes, in ascending order from wordline 15, first electrode material 44, select device material 46, second electrode material 48, programmable material 26, third electrode material 50, and conductive extension material 52.

The first, second and third electrode materials 44, 48 and 50 may comprise any suitable compositions or combinations of compositions; and in some embodiments may comprise, consist essentially of, or consist of one or more of carbon, WSiN and TiSiN, where the chemical formulas indicate primary constituents rather than indicating specific stoichiometries. The electrode material may or may not be doped. In some example embodiments, carbon-containing electrode material may be doped with, for example, nitrogen and/or boron. The first, second and third electrode materials may be the same as one another in some embodiments. In other embodiments, at least one of the electrode materials may be different than another. Although the electrode materials are shown to be homogeneous, in some embodiments at least one of the electrode materials may be a laminate of two or more different compositions.

The select device material 46 is incorporated into select devices suitable for utilization in a memory array. The select devices may be any suitable devices; including, for example, ovonic devices, diodes, bipolar junction transistors, field effect transistors, switches, etc. Accordingly, although a single select device material is illustrated, in other embodiments there may be multiple select device materials. In the illustrated embodiment, the single select device material may be semiconductor material suitable for utilization in diodes or bipolar junction transistors, or may be chalcogenide suitable for utilization in ovonic devices.

The programmable material may comprise any suitable composition. In some embodiments, the programmable material may comprise a phase change material, such as a chalcogenide. For example, the programmable material may comprise germanium, antimony and tellurium; and may correspond to a chalcogenide commonly referred to as GST. In other example embodiments, the programmable material may comprise other compositions suitable for utilization in other types of memory besides phase change memory. For instance, the programmable material may comprise one or more compositions suitable for utilization in CBRAM or other types of resistive RAM.

The conductive extension material 52 may comprise any suitable composition or combination of compositions; and in some embodiments may comprise one or more metals or metal-containing compositions. For instance, the conductive extension material 52 may comprise one or more of tungsten, titanium nitride, copper, etc.

The conductive extension material 52 forms a conductive extension 54 between the memory cell 21 and the bitline 12.

The second vertical stack 42 includes, in ascending order from wordline 16, conductive extension material 52, first electrode material 44, select device material 46, second electrode material 48, programmable material 26 and third electrode material 50.

The conductive extension material 52 of vertical stack 42 forms a conductive extension 56 between the memory cell 22 and the wordline 16.

The first, second and third electrode materials are incorporated into first, second and third electrodes, respectively. In some embodiments the electrode materials may have other identifiers besides the stated "first, second and third". For instance, in some embodiments the programmable material may be referred to as being sandwiched between first and second electrodes.

Although the materials of the second vertical stack 42 are described as being the same as those of the first vertical stack 40, in other embodiments one or more of the materials may differ from one stack to the other. For instance, the conductive extension material utilized in vertical stack 42 may be different than that utilized in vertical stack 40.

A dielectric region 58 is between the vertical stacks 40 and 42. Such dielectric region comprises one or more dielectric materials. The dielectric materials may be any suitable compositions or combinations of compositions; including, for example, one or more of silicon nitride, silicon dioxide, etc.

The select device material 46 forms first and second select devices 60 and 62 within the stacks 40 and 42, respectively. Although the illustrated configuration has the select devices between the programmable material 26 and the wordlines 15 and 16, in other embodiments at least one of the select devices may be placed between programmable material and the bitline 12.

The configuration of FIG. 6 has all of the materials 44, 46, 48, 26 and 50 of the second stack 42 vertically offset from the materials of the first stack 40. In other embodiments, one or more of the materials within stack 42 may be at a common elevation with materials within stack 40. Such may enable materials within stack 42 to be formed in a common deposition step with materials within stack 40, which may simplify processing and reduce fabrication costs.

FIG. 7 shows a portion of a memory array 10d in which some of the materials within stack 42 are at a common elevational height as materials within stack 40. The configuration of FIG. 7 has the programmable material 26 and select device material 46 arranged within stack 40 so that the select device material is on top of (e.g., above) the programmable material. Also, the configuration of FIG. 7 has the electrode material 48 of stack 40 at a common elevational height as electrode material 44 of stack 42, the select device material 46 of stack 40 at a common elevational height as the select device material within stack 42, and the electrode material 50 within stack 40 at a common elevational height as electrode material 48 within stack 42. Accordingly, the electrode material 48 of stack 40 may be deposited simultaneously with the electrode material 44 of stack 42, the select device material 46 of stacks 40 and 42 may be simultaneously deposited, and the electrode material 50 within stack 40 may be deposited simultaneously with electrode material 48 of stack 42. Thus, fabrication of the memory array 10d of FIG. 7 may comprise fewer processing steps than fabrication of the memory array 10c of FIG. 6, which may advantageously reduce time and expense for fabrication of memory 10d as compared to fabrication of memory 10c.

The embodiments of FIGS. 6 and 7 are example embodiments of memory arrays in which programmable material within a vertical stack is vertically offset relative to programmable material within a neighboring vertical stack. In other embodiments, different vertical stack configurations may be utilized (for instance, the select device material may be omitted and/or one or more of the electrode materials may be omitted), and different degrees of vertical offset may be provided (for instance, there may be some vertical overlap of programmable material within the neighboring stacks). FIGS. 8-12 illustrate some additional example memory array configurations. The configurations show particular structures and materials between bitlines and wordlines. Dashed lines are utilized to indicate that there may be additional structures or materials within the illustrated configurations besides those that are specifically illustrated.

Figure 9:
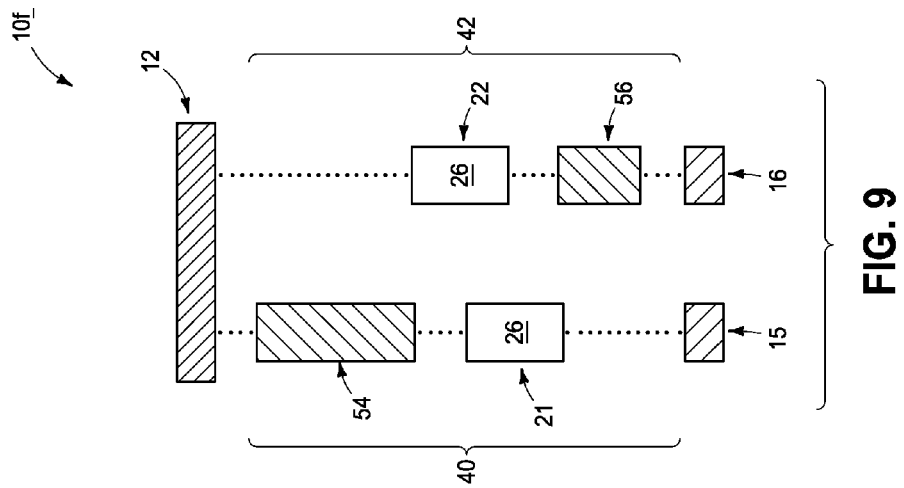
FIGS. 8-12 are diagrammatic sectional views of regions of example embodiment memory arrays.
Figure 8:
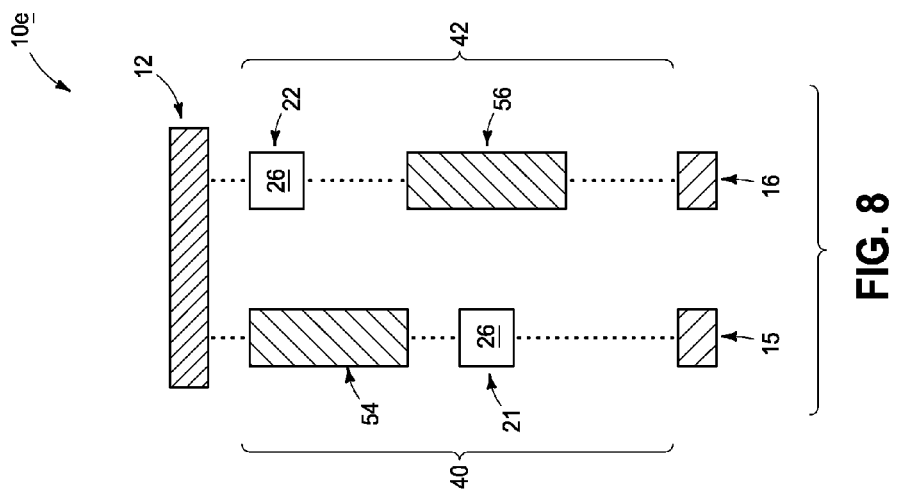

Referring to FIG. 8, a portion of a memory array 10e shown to comprise a memory cell 21 within a vertical stack 40 containing a conductive extension 54, and a memory cell 22 within a neighboring vertical stack 42 containing a conductive extension 56. The memory cells 21 and 22 are entirely vertically offset relative to one another so that there is no vertical overlap between programmable materials of the memory cells. In contrast, FIG. 9 shows a portion of a memory array 10f in which there is partial vertical overlap between the programmable material of the memory cell 21 and the neighboring memory cell 22. The particular configuration of FIG. 9 has conductive extension 56 shorter than conductive extension 54 in order to achieve the partial vertical overlap between the memory cells 21 and 22.

The configurations of FIGS. 8 and 9 may or may not comprise the various select devices and electrodes described above with reference to FIGS. 6 and 7.

Figure 12:
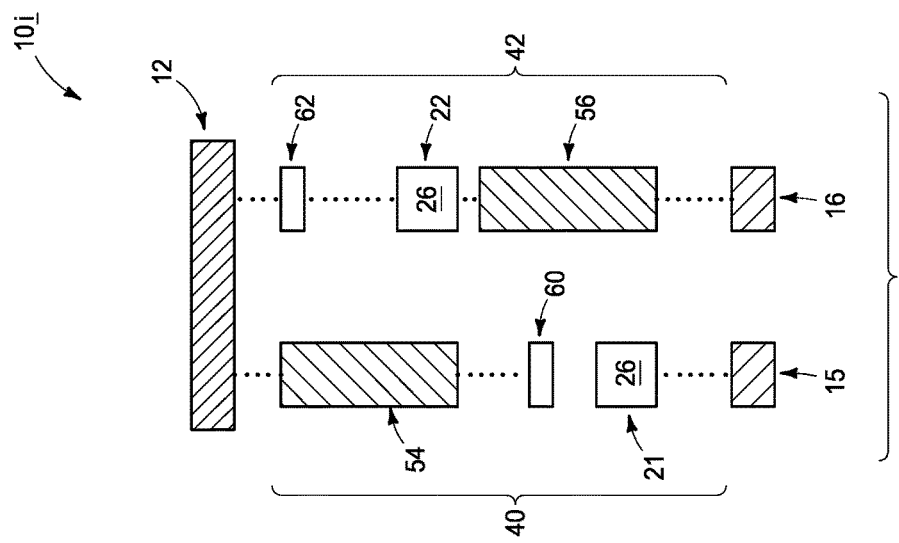
Figure 11:
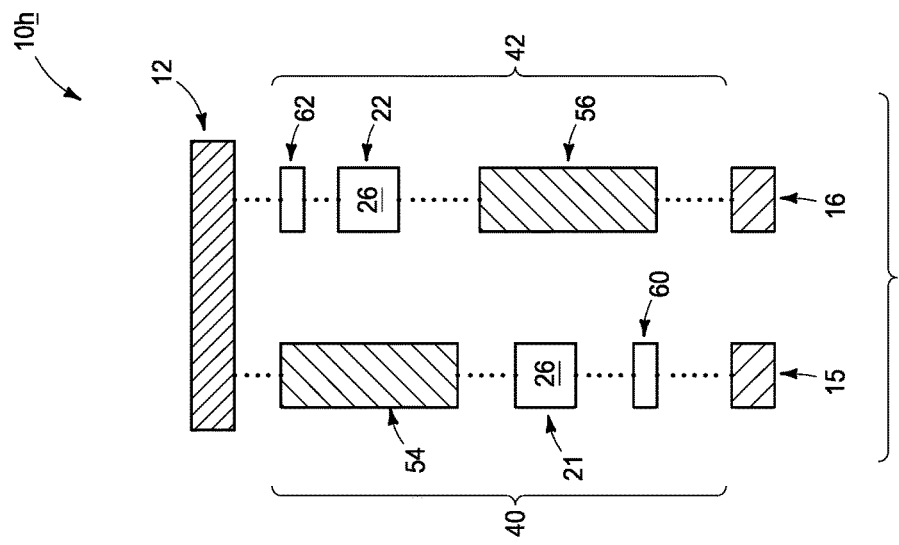
Figure 10:
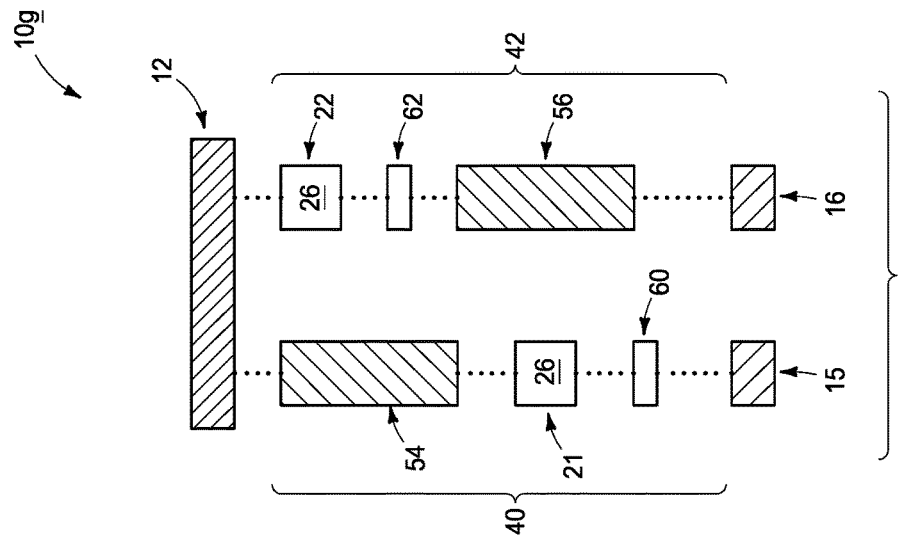

The select devices 60 and 62 of FIGS. 6 and 7 may have any suitable arrangement relative to the memory cells within the vertical stacks 40 and 42. FIGS. 10-12 illustrate some example arrangements. FIG. 10 illustrates a portion of a memory array 10g in which the select device 60 within stack 40 is between the memory cell 21 and the wordline 15, and in which the select device 62 within stack 42 is between the memory cell 22 and the wordline 16 (e.g., both of the select devices 60 and 62 are beneath the programmable material of memory cells). The configuration of FIG. 10 may be identical to that of FIG. 6 in some embodiments. In contrast, FIG. 11 shows a portion of a memory array 10h in which the select device 62 within the vertical stack 42 is between the memory cell 22 and the bitline 12, while the select device 60 within stack 40 is between the memory cell 21 and the wordline 15 (e.g., one of the select devices is beneath the programmable material of a memory cell, and the other is above the programmable material of a memory cell). FIG. 12 shows yet another configuration, and specifically shows a portion of a memory array 10i in which the select device 62 within the vertical stack 42 is between the memory cell 22 and the bitline 12, and in which the select device 60 within stack 40 is also between the bitline 12 and the memory cell 21 (e.g., both of the select devices 60 and 62 are above the programmable material of memory cells). In some embodiments, FIGS. 10 and 12 may be considered to illustrate applications in which select devices 60 and 62 are on a same (i.e., common) side of the memory cells 21 and 22 as one another, and FIG. 11 may be considered to illustrate an application in which the select devices 60 and 62 are on opposite sides of memory cells 21 and 22 relative to one another.

In some embodiments, a memory device (e.g., a device 10, 10a, 10b, etc.) is provided which has a first memory cell 21 with a first programmable material 26 and a second memory cell 22 with a second programmable material 26 (although both cells have the same programmable material 26 as one another, in other embodiments the programmable materials of the memory cells may differ). The first and second programmable materials are not faced (for example the second programmable material of memory cell 22 is vertically offset with respect to the first programmable material of memory cell 21). In some embodiments, the first and second programmable materials comprise a phase-change material (for example a chalcogenide material). In some embodiments the second programmable material is not facing the first programmable material only in part, e.g., a portion of the second programmable material faces a portion of the first programmable material. The first and second memory cells may further comprise, in some embodiments, first and second select devices (e.g., 60 and 62) respectively in series with first and second programmable materials. In some embodiments, the first and second select devices are formed on the same side of the first and second programmable materials (e.g., with respect to data/sense lines and/or to access lines). In other embodiments, the first and second select devices are formed on different sides (e.g., opposite sides) of the first and second programmable materials (e.g., with respect to data/sense lines and/or to access lines).

The memory arrays described above may be formed with any suitable processing. FIGS. 13-22 illustrate example processing which may be utilized to form an example embodiment memory array.

Referring to FIG. 13, a construction 10j includes a stack 70 formed over a series of wordlines 14-17.

The wordlines are spaced from one another by dielectric material 75 (for instance, silicon dioxide, silicon nitride, etc.) and may be over an underlying substrate (not shown).

The underlying substrate may comprise semiconductor material; and may, for example, comprise, consist essentially of, or consist of monocrystalline silicon. The substrate may be a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The wordlines 14-17 comprise wordline material (i.e., access line material) 72. The wordline material may comprise any suitable composition or combination of compositions; and in some embodiments may comprise, consist essentially of, or consist of one or more metals (for instance, copper), metal-containing compositions (for instance, metal nitrides, metal silicides, alloys of two or more metals, etc.), graphene and/or conductively-doped semiconductor materials (for instance, conductively-doped silicon, conductively-doped germanium, etc.).

The stack 70 comprises electrode material 44, select device material 46, electrode material 48, programmable material 26, electrode material 50 and dielectric material 74; and may be referred to as a first stack to distinguish it from another stack formed at a later processing stage.

The dielectric material 74 may comprise any suitable composition or combination of compositions; and in some embodiments may comprise, consist essentially of, or consist of silicon nitride.

Figure 14:
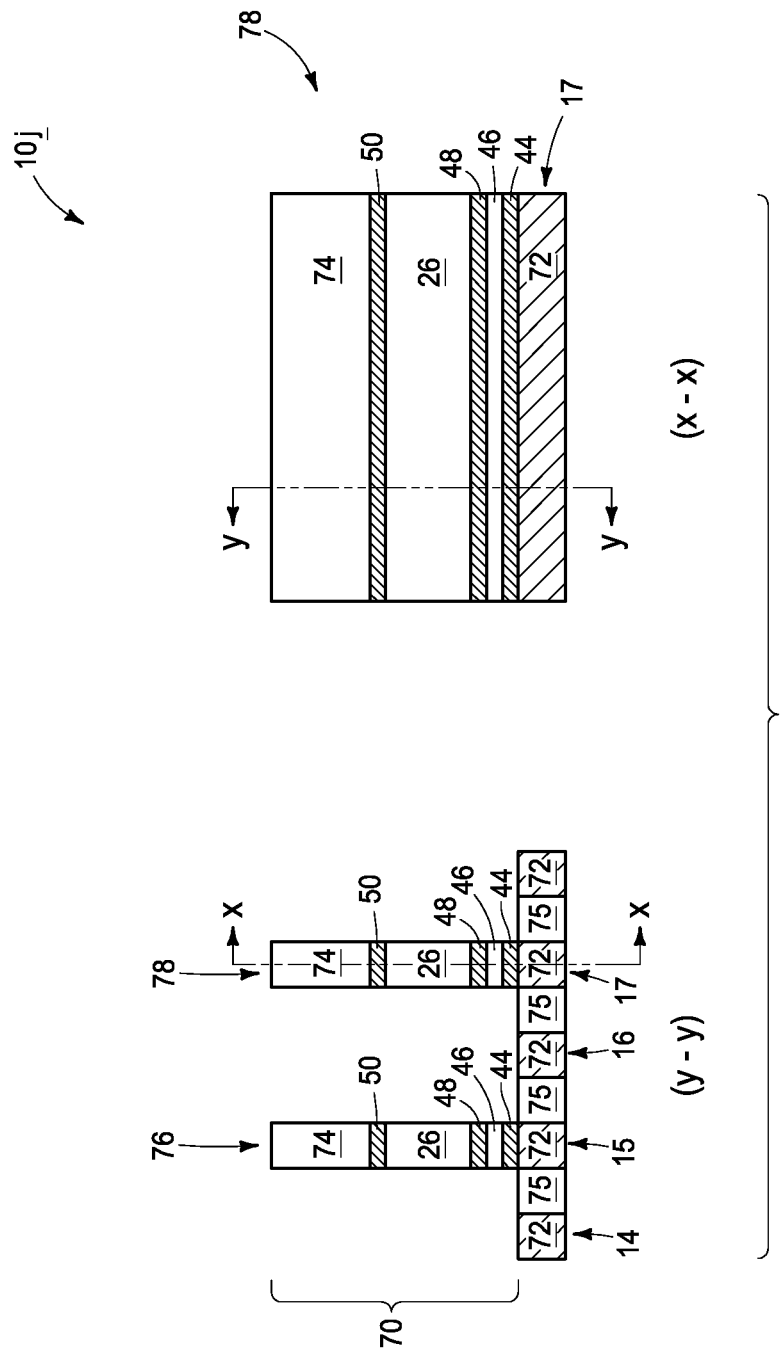

Referring to FIG. 14, the stack 70 is patterned with one or more suitable etches through materials 44, 46, 48, 26, 50 and 74. Such patterning forms the first stack into a first series of panels (example panels are shown as panels 76 and 78), with individual panels being over and along every other one of the wordlines (for instance, individual panels 76 and 78 are over wordlines 15 and 17). The panels may be alternatively referred to as slices, fences, walls, rails, etc.

Figure 15:
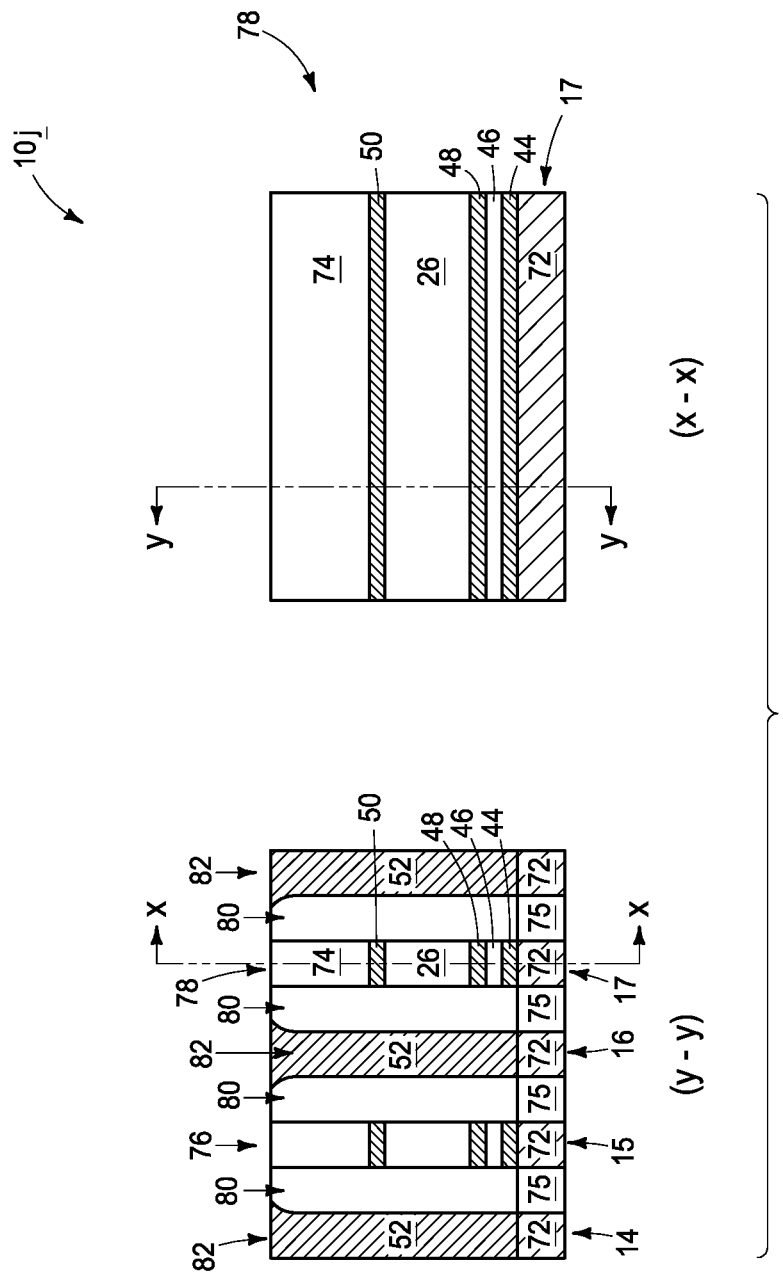

Referring to FIG. 15, dielectric spacers (which may also be referred to as liners) 80 are formed adjacent panels 76 and 78. The dielectric spacers may comprise, for example, silicon nitride, and may be formed with a deposition followed by an anisotropic etch.

Openings 82 remain between the dielectric spacers, and such openings are filled with conductive material 52.

Figure 16:
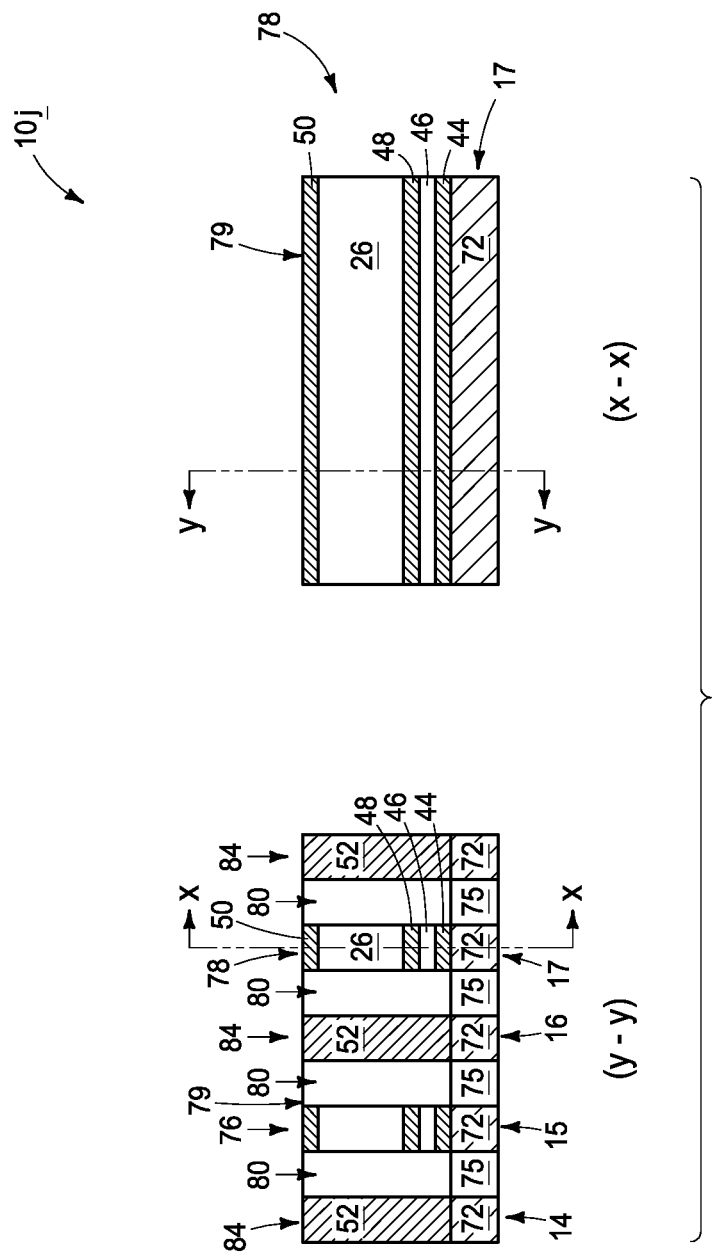

Referring to FIG. 16, the dielectric material 74 (FIG. 15) is removed with a planarizing etch (for instance, chemical-mechanical polishing) to form a planarized upper surface 79. The conductive material 52 forms first conductive plates 84 which are between and along the panels 76 and 78. The conductive plates 84 alternate with panels 76 and 78 along a direction orthogonal to the wordline direction (with the wordline direction being along the cross-section section x-x, and being in and out of the page relative to cross-section y-y). The conductive plates 84 may ultimately form conductive material extensions 56 of the type described in some of the previous figures.

Figure 17:
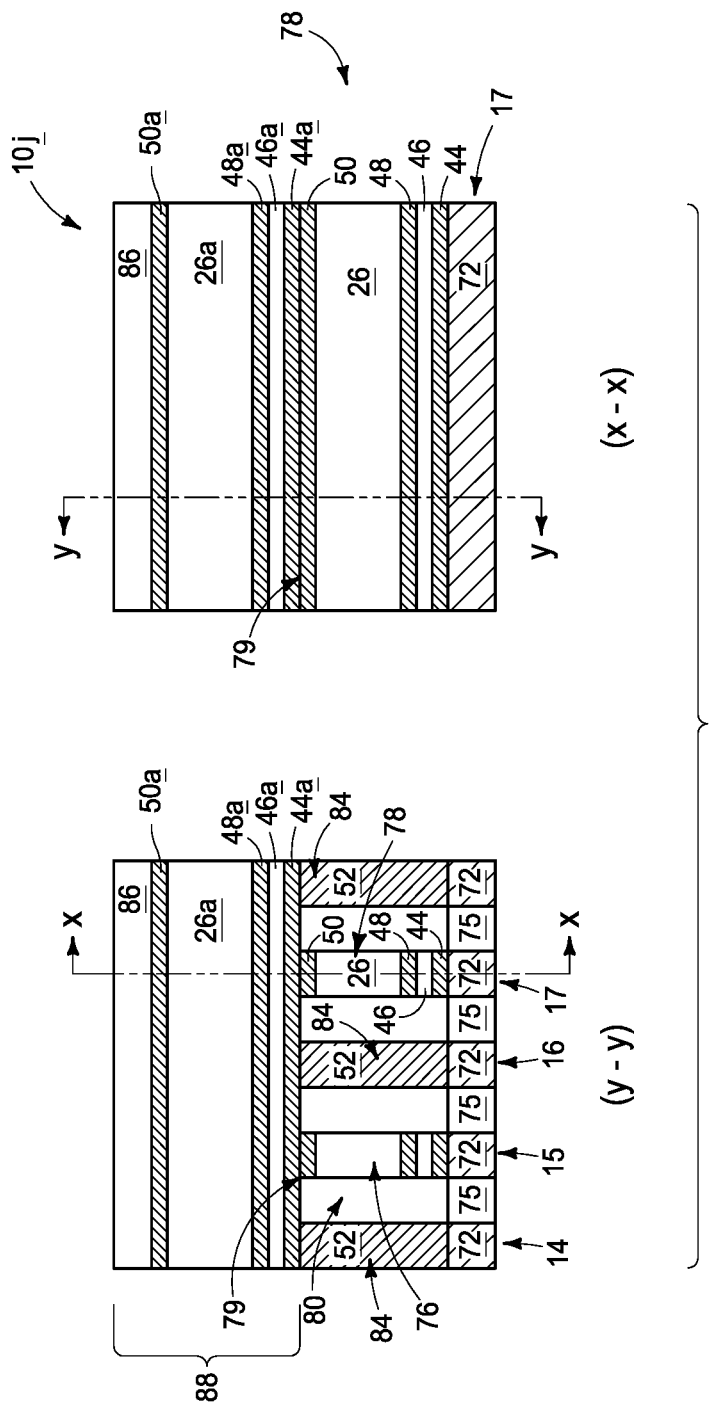

Referring to FIG. 17, a second stack 88 is formed over planarized surface 79. The second stack comprises electrode material 44a, select device material 46a, electrode material 48a, programmable material 26a, electrode material 50a and dielectric material 86.

The dielectric material 86 may comprise any suitable composition or combination of compositions; and in some embodiments may comprise, consist essentially of, or consist of silicon nitride.

The materials 44a, 46a, 48a, 26a and 50a may be compositionally the same as materials 44, 46, 48, 26 and 50, respectively; or at least one of the materials 44a, 46a, 48a, 26a and 50a of the second stack 88 may be different than a corresponding material 44, 46, 48, 26 and 50 of the first stack 70 (FIG. 13).

Figure 18:
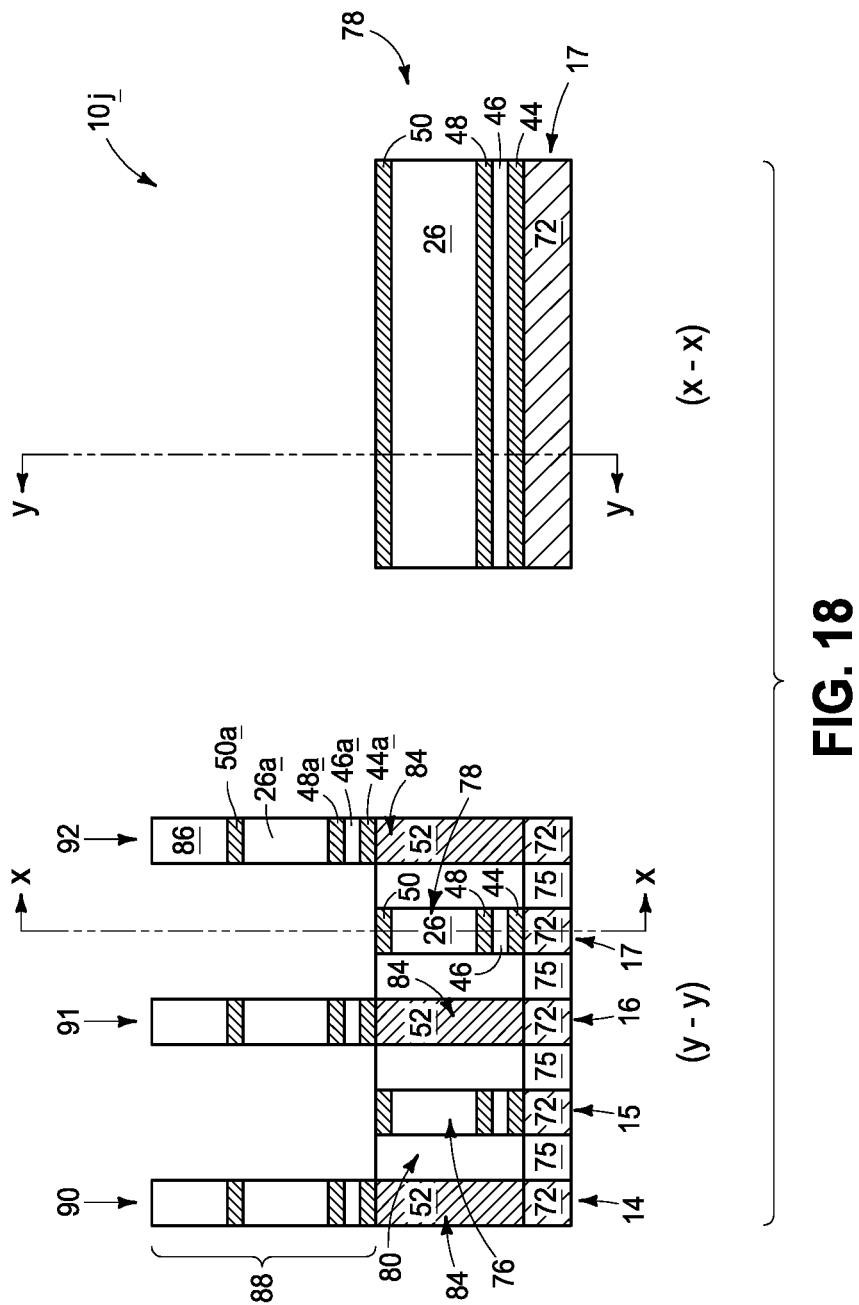

Referring to FIG. 18, the stack 88 is patterned with one or more suitable etches through materials 44a, 46a, 48a, 26a, 50a and 86. Such patterning forms the second stack 88 into a second series of panels (example panels are shown as panels 90-92), with individual panels being over and along the conductive plates 84.

Figure 19:
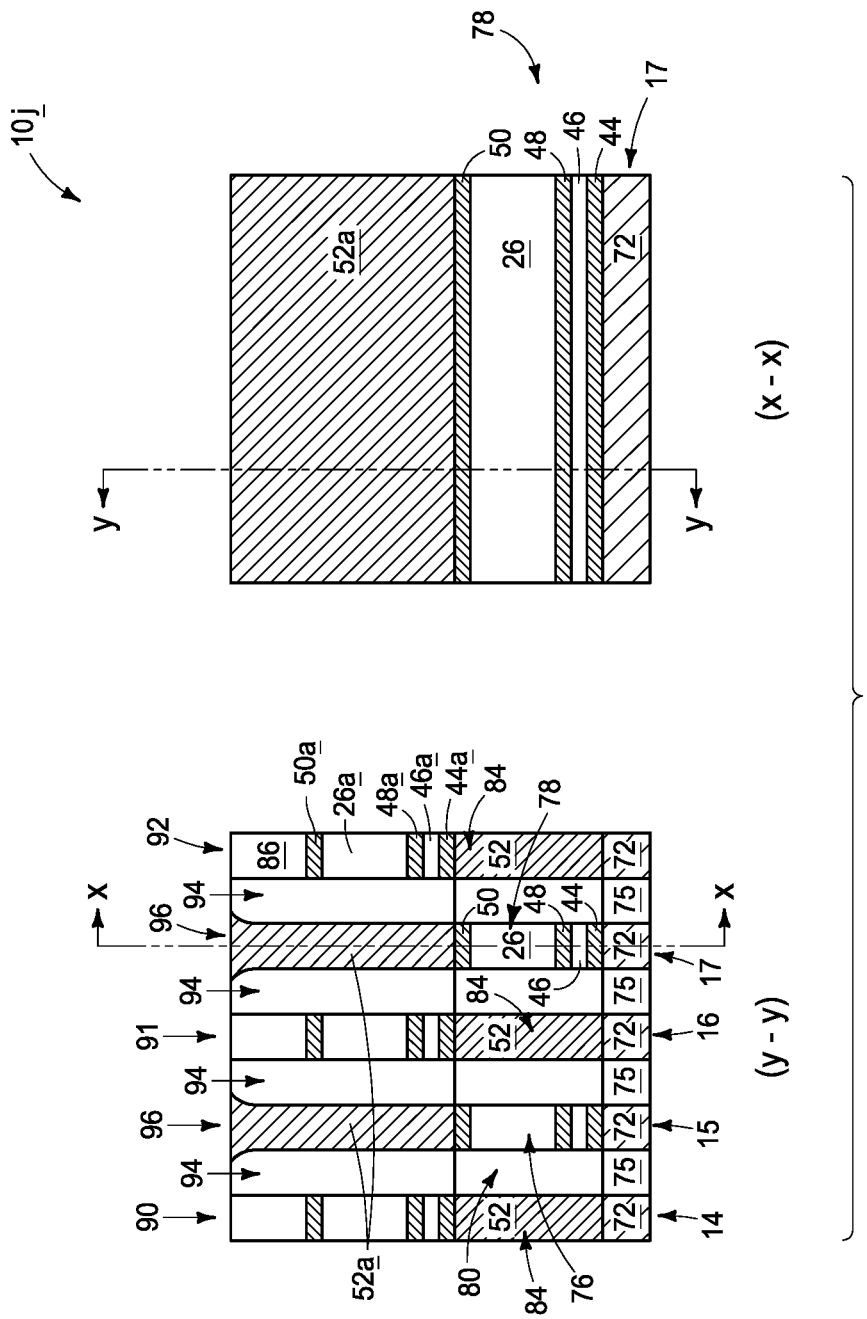

Referring to FIG. 19, dielectric spacers (or liners) 94 are formed adjacent panels 90-92. The dielectric spacers may comprise, for example, silicon nitride, and may be formed with a deposition followed by an anisotropic etch. In some embodiments, the dielectric spacers 80 (FIG. 15) and 94 may be referred to as first and second dielectric spacers (or liners), respectively.

Openings 96 remain between the dielectric spacers, and such openings are filled with conductive material 52a. The material 52a may be a same composition as material 52, or may be a different composition.

Figure 20:
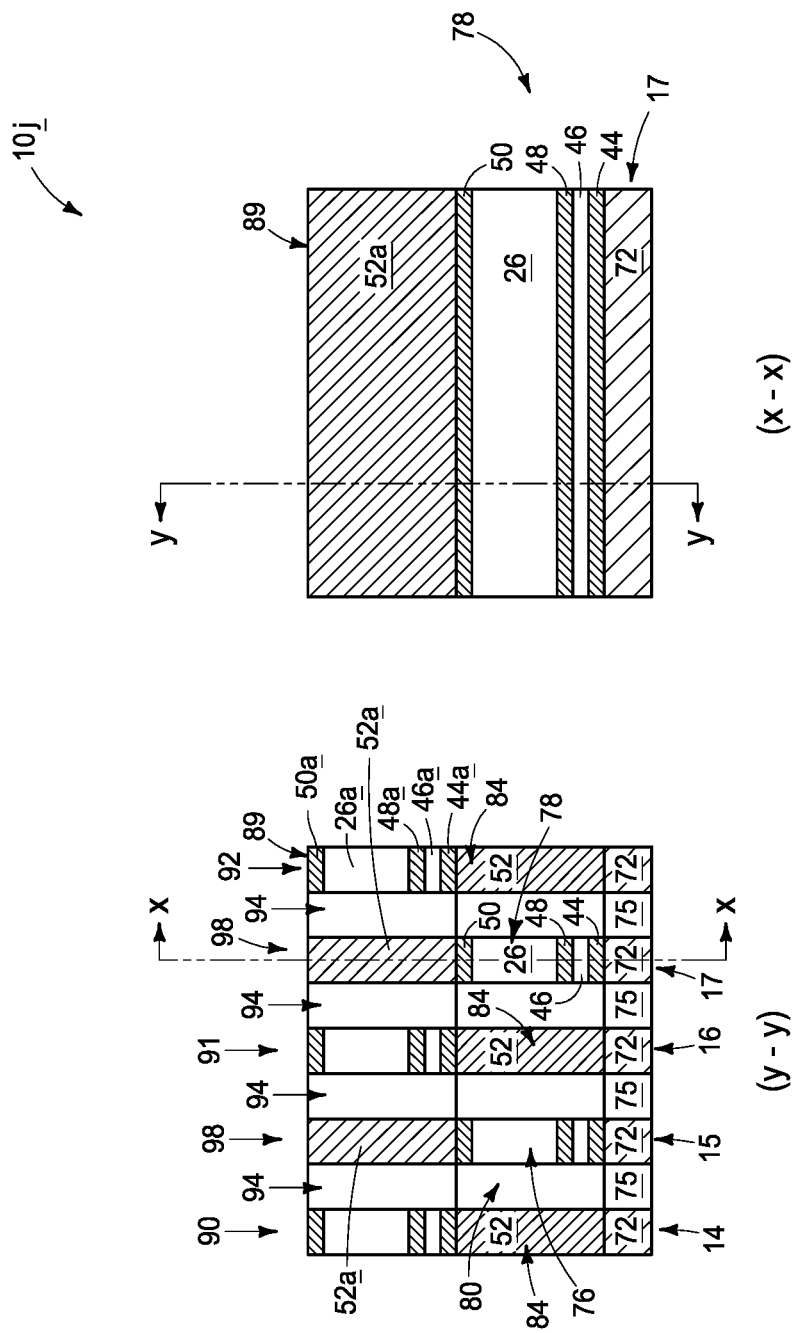

Referring to FIG. 20, the dielectric material 86 (FIG. 19) is removed with a planarizing etch (for instance, chemical-mechanical polishing) to form a planarized upper surface 89. The conductive material 52a forms second conductive plates 98 which are between and along the second panels 90-92, and which are directly over the first panels 76 and 78. The conductive plates 98 alternate with panels 90-92 along a direction orthogonal to the wordline direction. The conductive plates 98 may ultimately form conductive material extensions 54 of the type described in some of the previous figures.

Figure 21:
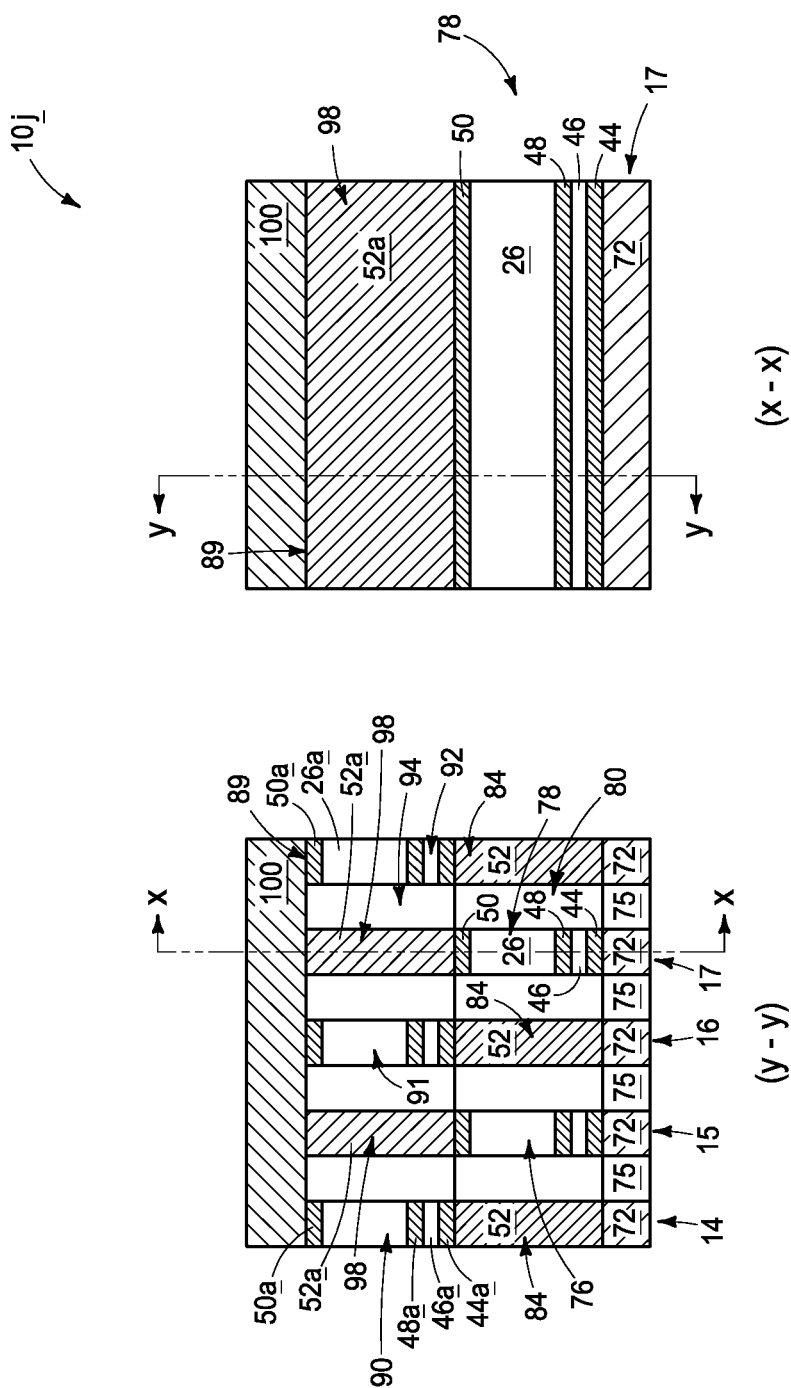

Referring to FIG. 21, bitline material (i.e., data/sense line material) 100 is formed across planarized surface 89. The bitline material may comprise any suitable composition or combination of compositions; and in some embodiments may comprise, consist essentially of, or consist of one or more metals (for instance, copper), metal-containing compositions (for instance, metal nitrides, metal silicides, alloys of two or more metals, etc.), graphene and/or conductively-doped semiconductor materials (for instance, conductively-doped silicon, conductively-doped germanium, etc.).

Figure 22:
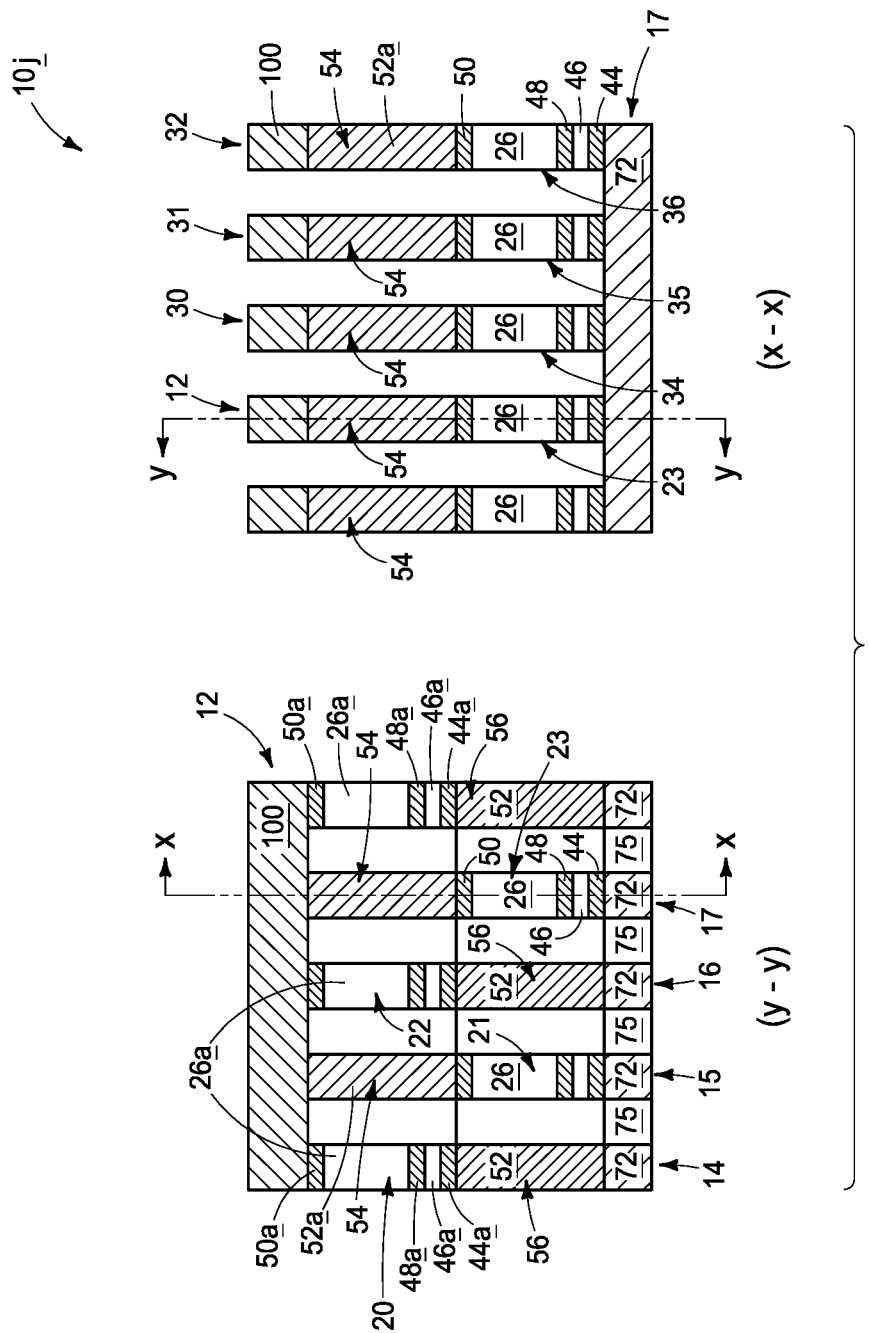

Referring to FIG. 22, the bitline material 100 is patterned into bitlines 12, 30, 31 and 32. The pattern of the bitlines extends through plates 84 and 98 (FIG. 21) to form conductive extensions 54 and 56 from such plates. The pattern of the bitlines is also extended through the panels 76, 78, 90, 91 and 92 (FIG. 21). The patterned panels 76 and 78, together with conductive extensions 54 form a first series of pillars having programmable material 26 at a first height above wordlines 14-17 (e.g., above wordlines 15 and 17 in the shown embodiment); and the patterned panels 90-92 together with conductive extensions 56 form a second series of pillars having programmable material 26a at a second height above the wordlines 14-17 (e.g., above wordlines 14 and 16 in the shown embodiment). The programmable materials 26 and 26a thus form a series of memory cells 20-23 alternating between a first height and a second height analogous to the construction described above with reference to FIG. 3.

In the illustrated embodiment of FIG. 22, the programmable material of neighboring memory cells does not vertically overlap. In other embodiments, the programmable material of neighboring memory cells may vertically overlap, analogous to the construction described above with reference to FIG. 9. Also, in the embodiment of FIG. 22 the programmable material of memory cells along a common row as one another (for instance, the programmable material of the memory cells 23, 34, 35 and 36 shown along the wordline 17 in the x-x view) are in a vertically static arrangement, or in other words at a same height as one another (similar to the embodiment described above with reference to FIG. 5). In other embodiments, the programmable material of memory cells along a common row as one another (for instance, the programmable material of the memory cells 23, 34, 35 and 36 shown along the wordline 17 in the x-x view) may be in a configuration such that neighboring cells are vertically offset relative to one another (similar to the embodiment described above with reference to FIG. 4).

Other materials (not shown) may be present in the construction of FIG. 22. Such other materials may be provided, for example, to tune stack resistance, to improve adhesion between adjacent materials and/or to modify interdiffusion of adjacent materials.

Methods of forming example embodiments of a memory array are provided. According to an embodiment, the method comprises forming a first memory cell with a first programmable material and forming a second memory cell with a second programmable material, wherein the second programmable material is not fully aligned with (i.e., not facing) the first programmable material (for example the second programmable material is vertically offset with respect to the first programmable material). In some embodiments, the first and second programmable materials comprise a phase-change material (for example a chalcogenide material). In some embodiments the second programmable material is not facing the first programmable material only in part, e.g., a portion of the second programmable material faces a portion of the first programmable material. The method may further comprise forming first and second select devices, respectively, in series with first and second programmable materials. In some embodiments, first and second select devices are formed on the same side of the first and second programmable materials (e.g., with respect to data/sense lines and/or to access lines). In other embodiments, first and second select devices are formed on different sides (e.g., opposite sides) of the first and second programmable materials (e.g., with respect to data/sense lines and/or to access lines).

A memory array according to any of the embodiments described above may be incorporated into a 3D (i.e., three-dimensional) memory configuration (for example a 3D cross point memory array) as one deck of the 3D configuration. In some embodiments, all decks of the 3D memory configuration may comprise an array according to one or more embodiments described above. The 3D configuration may be referred to as an assembly, structure, etc., and comprises multiple decks (or tiers) of row/column arrangements (i.e., 2D arrays) stacked one atop another.

The structures and assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "insulative" may be utilized to describe materials having insulative electrical properties. The terms are considered synonymous in this disclosure. The utilization of the term "dielectric" in some instances, and the term "insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a memory array includes a first memory cell, and a second memory cell directly adjacent to the first memory cell along a lateral direction. The second memory cell is vertically offset relative to the first memory cell.

In some embodiments, a memory array includes memory cells arranged in a grid having columns and rows. The memory cells have programmable regions. The programmable regions of memory cells in a common column as one another alternate in height between first height and a second height which is vertically offset relative to the first height, and/or the programmable regions of memory cells in a common row as one another alternate in height between the first height and the second height.

In some embodiments, a memory array includes a series of data/sense lines extending along a first direction, a series of access lines extending along a second direction which intersects the first direction, and memory cells vertically between the access lines and the data/sense lines. The memory cells are arranged in a grid having columns along the first direction and rows along the second direction. The memory cells in a common column as one another are arranged in two alternating sets along the first direction; with the sets being a first set having memory cells at a first height and a second set having memory cells at a second height which is vertically offset relative to the first height.

In some embodiments, a method of forming a memory array includes forming a first stack over a series of access lines. The first stack comprises first programmable material between a first electrode material and a second electrode material. The access lines extend along an access line direction. The first stack is patterned into a first series of panels, with individual panels of the first series being over and along every other one of the access lines. First conductive plates are formed between the panels of the first series and along the access lines not under individual panels of the first series. The first conductive plates alternate with the individual panels of the first series along a direction orthogonal to the access line direction. A second stack is formed over the first series of panels and over the first conductive plates. The second stack comprises second programmable material between a third electrode material and a fourth electrode material. The second stack is patterned into a second series of panels, with individual panels of the second series being over and along the first conductive plates. Second conductive plates are formed between the panels of the second series and over the panels of the first series. The second conductive plates alternate with the individual panels of the second series along the direction orthogonal to the access line direction. The first series of panels and second conductive plates are patterned into a first series of pillars while the second series of panels and first conductive plates are patterned into a second series of pillars; with said first series of pillars having the first programmable material at a first height and said second series of pillars having the second programmable material at a second height which is above the first height.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory array, comprising:
 forming a first stack over a series of access lines, the first stack comprising first programmable material between a first electrode material and a second electrode material; the access lines extending along an access line direction;
 patterning the first stack into a first series of panels, with individual panels of the first series being over and along every other one of the access lines;
 forming first conductive plates between the panels of the first series and along the access lines not under individual panels of the first series; the first conductive plates alternating with the individual panels of the first series along a direction orthogonal to the access line direction;
 forming a second stack over the first series of panels and over the first conductive plates, the second stack comprising second programmable material between a third electrode material and a fourth electrode material;

patterning the second stack into a second series of panels, with individual panels of the second series being over and along the first conductive plates;

forming second conductive plates between the panels of the second series and over the panels of the first series; the second conductive plates alternating with the individual panels of the second series along the direction orthogonal to the access line direction; and patterning the first series of panels and second conductive plates into a first series of pillars while patterning the second series of panels and first conductive plates into a second series of pillars; with said first series of pillars having the first programmable material at a first height and said second series of pillars having the second programmable material at a second height which is above the first height.

2. The method of claim 1 further comprising forming data/sense line material over the second stack and patterning the data/sense line material into data/sense lines while patterning the second stack into the second series of panels.

3. The method of claim 1 wherein the first and second programmable materials are a same composition as one another.

4. The method of claim 1 wherein the first and second programmable materials both comprise chalcogenide.

5. The method of claim 1 wherein the first and second stacks comprise first and second select device materials, respectively; with the first select device material being spaced from the first programmable material by the first electrode material and with the second select device material being spaced from the second programmable material by the third electrode material.

6. The method of claim 1 further comprising forming first nitride-containing liners along the first panels prior to forming the first conductive plates, and forming second nitride-containing liners along the second panel prior to forming the second conductive plates.

7. A method of forming a memory array, comprising:
forming a first memory cell;
forming a second memory cell directly adjacent to the first memory cell along a lateral direction, and vertically offset relative to the first memory cell;
forming first and second wordlines over a substrate, the first and second wordlines being at a common elevation with each other, with the first memory cell being disposed over the first wordline and the second memory cell being disposed over the second wordline; and
forming a bitline extending across the first and second memory cells and being electrically coupled to the first and second memory cells; the first memory cell being in a first vertical stack having a conductive extension material between the first memory cell and the bitline; the second memory cell being in a second vertical stack lacking a conductive extension between the second memory cell and the bitline, the second vertical stack comprising a first electrode material over and spaced from the second wordline, a programmable material over the first electrode material and an upper electrode material over the programmable material and in physical contact with the bitline.

8. The method of claim 7 wherein the first and second memory cells change in resistivity in transitioning from one memory state to another.

9. The memory array of claim 7 wherein the first and second memory cells comprise programmable regions containing phase change material.

10. The method of claim 9 wherein the phase change material comprises chalcogenide.

11. The method of claim 7 wherein:
the first and second memory cells comprise programmable regions; and
the programmable region of the first memory cell vertically overlaps the programmable region of the second memory cell.

12. The method of claim 7 wherein the first and second memory cells comprise programmable regions, and wherein the programmable region of the first memory cell does not vertically overlap the programmable region of the second memory cell.

13. A method of forming a memory array, comprising:
forming a series of data/sense lines extending along a first direction;
forming a series of access lines extending along a second direction which intersects the first direction;
forming memory cells vertically between the access lines and the data/sense lines, the memory cells being arranged in a grid having columns along the first direction and rows along the second direction, the memory cells each having a vertical stack comprising a first electrode material separated from a second electrode material by intervening materials comprising a programmable material and a select device material; and
wherein the memory cells in a common column as one another are formed in two alternating sets along the first direction; with the sets being a first set having memory cells at a first height and a second set having memory cells at a second height which is vertically offset relative to the first height, the second set having the first electrode material in direct physical contact with a single one of the data/sense lines and having the second electrode material spaced from an overlying access line, and the first set having the first electrode material spaced from a second one of the data/sense lines and the second electrode material in direct physical contact with the overlying access line.

14. The method of claim 13 wherein the memory cells in a common row as one another have a same height as one another.

15. The method of claim 13 wherein the memory cells in a common row as one another are arranged in the two alternating sets along the second direction.

16. The method of claim 13 wherein the memory cells of the first set are coupled to the data/sense lines through conductive extensions, and wherein the memory cells of the second set are coupled to the access lines through conductive extensions.

17. The method of claim 13 wherein the memory cells are part of vertically-extending stacks comprising programmable material sandwiched between first and second electrodes, and comprising select devices spaced from the programmable material by one of the first and second electrodes, wherein memory cells of the first set are within vertically-extending stacks having select devices beneath the programmable material, and wherein memory cells of the second set are within vertically-extending stacks having select devices beneath the programmable material.

18. The method of claim 13 wherein the memory cells are part of vertically-extending stacks comprising programmable material sandwiched between first and second electrodes, and comprising select devices spaced from the programmable material by one of the first and second electrodes, wherein the memory cells of the first set are within vertically-extending stacks having select devices beneath the programmable material, and wherein the memory cells of the second set are within vertically-extending stacks having select devices above the programmable material.

19. The method of claim 13 wherein the memory cells of the first and second sets comprise programmable regions, and wherein the programmable regions of the memory cells of the first set vertically overlap the programmable regions of the memory cells of the second set.

20. The method of claim 13 wherein the memory cells of the first and second sets comprise programmable regions containing phase change material.

* * * * *